United States Patent
Ban et al.

(10) Patent No.: US 10,396,049 B2
(45) Date of Patent: Aug. 27, 2019

(54) FAN-OUT SEMICONDUCTOR PACKAGE

(71) Applicant: SAMSUNG ELECTRONICS CO., LTD., Suwon-si (KR)

(72) Inventors: Young Min Ban, Suwon-si (KR); Han Kim, Suwon-si (KR); Kyung Moon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/725,179

(22) Filed: Oct. 4, 2017

(65) Prior Publication Data

US 2018/0033751 A1 Feb. 1, 2018

Related U.S. Application Data

(63) Continuation of application No. 15/454,416, filed on Mar. 9, 2017.

(30) Foreign Application Priority Data

Jun. 21, 2016 (KR) .................... 10-2016-0077593
Sep. 2, 2016 (KR) .................... 10-2016-0112983

(51) Int. Cl.
  *H01L 23/48* (2006.01)
  *H01L 23/00* (2006.01)
  (Continued)

(52) U.S. Cl.
  CPC .......... *H01L 24/06* (2013.01); *H01L 23/3128* (2013.01); *H01L 23/3171* (2013.01);
  (Continued)

(58) Field of Classification Search
  CPC . H01L 24/06; H01L 23/3171; H01L 23/3128; H01L 23/5226; H01L 23/5283; H01L 24/03; H01L 24/14; H01L 23/5389
  See application file for complete search history.

(56) References Cited

U.S. PATENT DOCUMENTS 6,187,615 B1 2/2001 Kim et al.
7,968,991 B2 6/2011 Wong et al.
(Continued)

FOREIGN PATENT DOCUMENTS

JP 2000-077570 A 3/2000
JP 2010-238702 A 10/2010
(Continued)

OTHER PUBLICATIONS

U.S. Non-Final Office Action dated Jul. 20, 2017 dated U.S. Appl. No. 15/454,416.
(Continued)

*Primary Examiner* — Alonzo Chambliss
(74) *Attorney, Agent, or Firm* — Sughrue Mion, PLLC

(57) ABSTRACT

A fan-out semiconductor package includes: a first interconnection member having a through-hole; a semiconductor chip disposed in the through-hole and having an active surface having a connection pad disposed thereon and an inactive surface opposing the active surface; an encapsulant encapsulating at least portions of the first interconnection member and the inactive surface of the semiconductor chip; and a second interconnection member disposed on the first interconnection member and the active surface of the semiconductor chip, wherein the first interconnection member and the second interconnection member include, respectively, redistribution layers electrically connected to the connection pad, the semiconductor chip includes a passivation layer having an opening exposing at least a portion of the connection pad, the redistribution layer of the second interconnection member is connected to the connection pad through a via, and the via covers at least a portion of the passivation layer.

23 Claims, 11 Drawing Sheets

(51) Int. Cl.
*H01L 23/31* (2006.01)
*H01L 23/528* (2006.01)
*H01L 23/522* (2006.01)
*H05K 1/18* (2006.01)

(52) U.S. Cl.
CPC ...... *H01L 23/5226* (2013.01); *H01L 23/5283* (2013.01); *H01L 24/03* (2013.01); *H01L 24/14* (2013.01); *H01L 24/20* (2013.01); *H05K 1/185* (2013.01); *H01L 2224/0235* (2013.01); *H01L 2224/02331* (2013.01); *H01L 2224/02379* (2013.01); *H01L 2224/0401* (2013.01); *H01L 2224/04105* (2013.01); *H01L 2224/05008* (2013.01); *H01L 2224/05017* (2013.01); *H01L 2224/05124* (2013.01); *H01L 2224/05569* (2013.01); *H01L 2224/05572* (2013.01); *H01L 2224/12105* (2013.01); *H01L 2224/13021* (2013.01); *H01L 2224/18* (2013.01); *H01L 2224/20* (2013.01); *H01L 2224/73204* (2013.01); *H01L 2924/15153* (2013.01); *H01L 2924/171* (2013.01); *H01L 2924/19105* (2013.01)

(56) References Cited

U.S. PATENT DOCUMENTS

| | | | |
|---|---|---|---|
| 8,183,095 B2 * | 5/2012 | Lin | H01L 21/78 438/127 |
| 8,941,230 B2 | 1/2015 | Kyozuka et al. | |
| 2006/0145328 A1 | 7/2006 | Hsu | |
| 2006/0220215 A1 | 10/2006 | Lee | |
| 2007/0145577 A1 | 6/2007 | Zeng et al. | |
| 2008/0246135 A1 | 10/2008 | Wong et al. | |
| 2009/0085192 A1 | 4/2009 | Hsu et al. | |
| 2010/0244280 A1 | 9/2010 | Shimizu et al. | |
| 2011/0221041 A1 * | 9/2011 | Lin | H01L 21/561 257/620 |
| 2011/0221055 A1 * | 9/2011 | Lin | H01L 21/563 257/692 |
| 2012/0013021 A1 | 1/2012 | Kobayashi et al. | |
| 2012/0161332 A1 * | 6/2012 | Chua | H01L 21/486 257/774 |
| 2013/0147019 A1 * | 6/2013 | Lin | H01L 21/561 257/620 |
| 2013/0249101 A1 | 9/2013 | Lin et al. | |
| 2013/0341784 A1 * | 12/2013 | Lin | H01L 24/19 257/737 |
| 2013/0341785 A1 | 12/2013 | Fu et al. | |
| 2014/0054800 A1 * | 2/2014 | Gatterbauer | H01L 24/05 257/782 |
| 2014/0182895 A1 | 7/2014 | Lee et al. | |
| 2014/0182896 A1 | 7/2014 | Lee et al. | |
| 2014/0182897 A1 | 7/2014 | Lee et al. | |
| 2014/0185258 A1 | 7/2014 | Lee et al. | |
| 2014/0246779 A1 * | 9/2014 | Lin | H01L 23/5389 257/773 |
| 2014/0332954 A1 * | 11/2014 | Morifuji | H01L 23/3128 257/737 |
| 2015/0001708 A1 | 1/2015 | Lin | |
| 2015/0155248 A1 * | 6/2015 | Lin | H01L 21/76879 257/737 |
| 2015/0187742 A1 | 7/2015 | Kwon et al. | |
| 2015/0228552 A1 * | 8/2015 | Lin | H01L 23/5389 257/773 |
| 2016/0043047 A1 | 2/2016 | Shim et al. | |
| 2016/0056126 A1 * | 2/2016 | Yu | H01L 21/565 257/737 |
| 2016/0148887 A1 * | 5/2016 | Yu | H01L 23/5389 257/773 |
| 2016/0172329 A1 | 6/2016 | Chang et al. | |
| 2016/0233166 A1 | 8/2016 | Teh et al. | |
| 2017/0040265 A1 | 2/2017 | Park et al. | |
| 2018/0026023 A1 * | 1/2018 | Lin | H01L 21/76877 438/109 |

FOREIGN PATENT DOCUMENTS

| | | |
|---|---|---|
| JP | 2012-39090 A | 2/2012 |
| KR | 2001-0004546 A | 1/2001 |
| KR | 10-0642643 B1 | 11/2006 |
| KR | 10-2013-0132162 A | 12/2013 |
| KR | 10-2016-0024379 A | 3/2016 |
| TW | 200725825 A | 7/2007 |
| TW | 201429353 A | 7/2014 |
| TW | 201431012 A | 8/2014 |
| TW | 201431456 A | 8/2014 |
| TW | 201436660 A | 9/2014 |
| TW | 201501223 A | 1/2015 |
| WO | 2011058879 A1 | 5/2011 |

OTHER PUBLICATIONS

Office Action issued in Taiwanese Patent Application No. 106107141, dated Jun. 5, 2018 (English translation).

Office Action issued in Japanese Patent Application No. 2017-044923, dated Jun. 19, 2018 (English translation).

Office Action issued in Korean Patent Application No. 10-2016-0112983, dated Jul. 31, 2018, including English translation (15 pages).

Office Action issued in Taiwanese Patent Application No. 10720784290, dated Aug. 24, 2018 (English Translation).

* cited by examiner

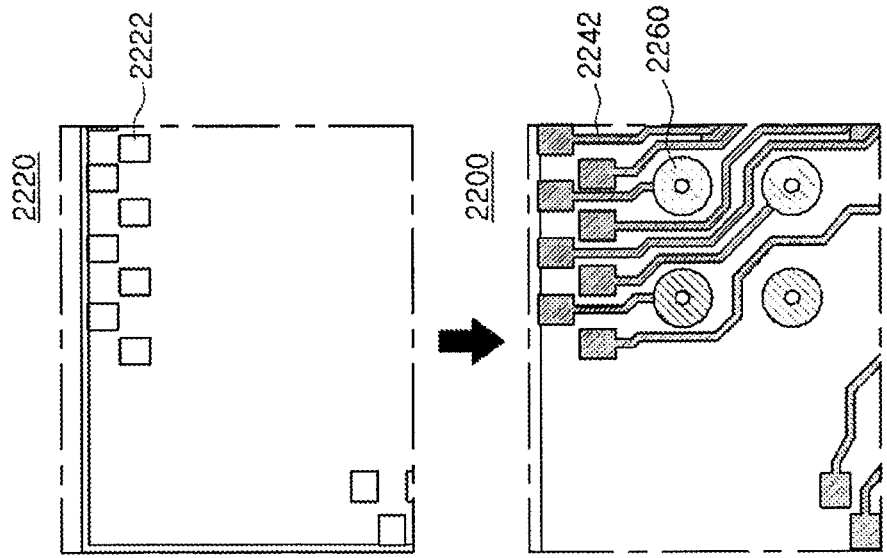
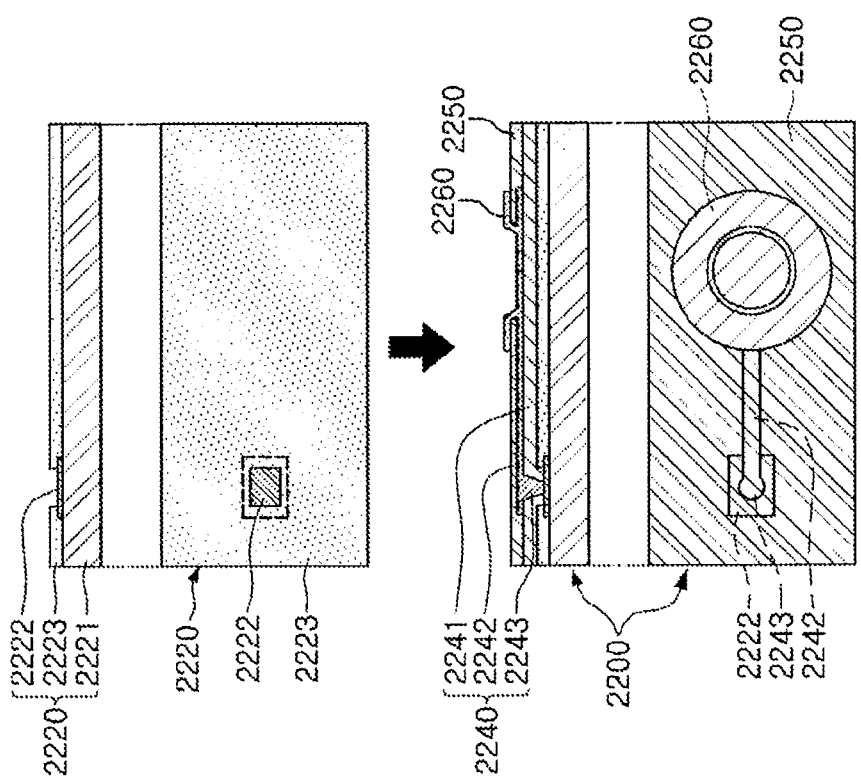
FIG. 3B
FIG. 3A

I-I'

FAN-OUT SEMICONDUCTOR PACKAGE

CROSS-REFERENCE TO RELATED APPLICATION(S)

This application is a continuation of U.S. patent application Ser. No. 15/454,416, filed on Mar. 9, 2017, which claims the benefit of priority to Korean Patent Application Nos. 10-2016-0077593 filed on Jun. 21, 2016 and 10-2016-0112983 filed on Sep. 2, 2016 in the Korean Intellectual Property Office, their entire disclosures of which are incorporated herein by reference.

BACKGROUND

1. Technical Field

The present disclosure relates to a semiconductor package, and more particularly, to a fan-out semiconductor package in which connection terminals may be extended outwardly of a region in which a semiconductor chip is disposed.

2. Description of Related Art

Recently, a significant recent trend in the development of semiconductor chip-related technology has been reducing the size of semiconductor chips. Therefore, in the area of package technology, in accordance with a rapid increase in demand for small-sized semiconductor chips, or the like, there has been increased demand for the implementation of a semiconductor package having a compact size while including a plurality of pins.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which corrosion of a connection pad that may occur due to various causes may be prevented.

One of several solutions suggested in the present disclosure is to prevent corrosion of a connection pad that may occur due to various causes in a temperature humidity bias (THB) by covering the entirety of an exposed surface of the connection pad with a via.

According to an aspect of the present disclosure, a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; and a second interconnection member disposed on the first interconnection member and the active surface of the semiconductor chip. The first interconnection member and the second interconnection member include, respectively, redistribution layers electrically connected to the connection pads, the semiconductor chip includes a passivation layer having an opening exposing at least a portion of the connection pad, the redistribution layer of the second interconnection member is connected to the connection pad through a via, and the via lies over at least a portion of the passivation layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
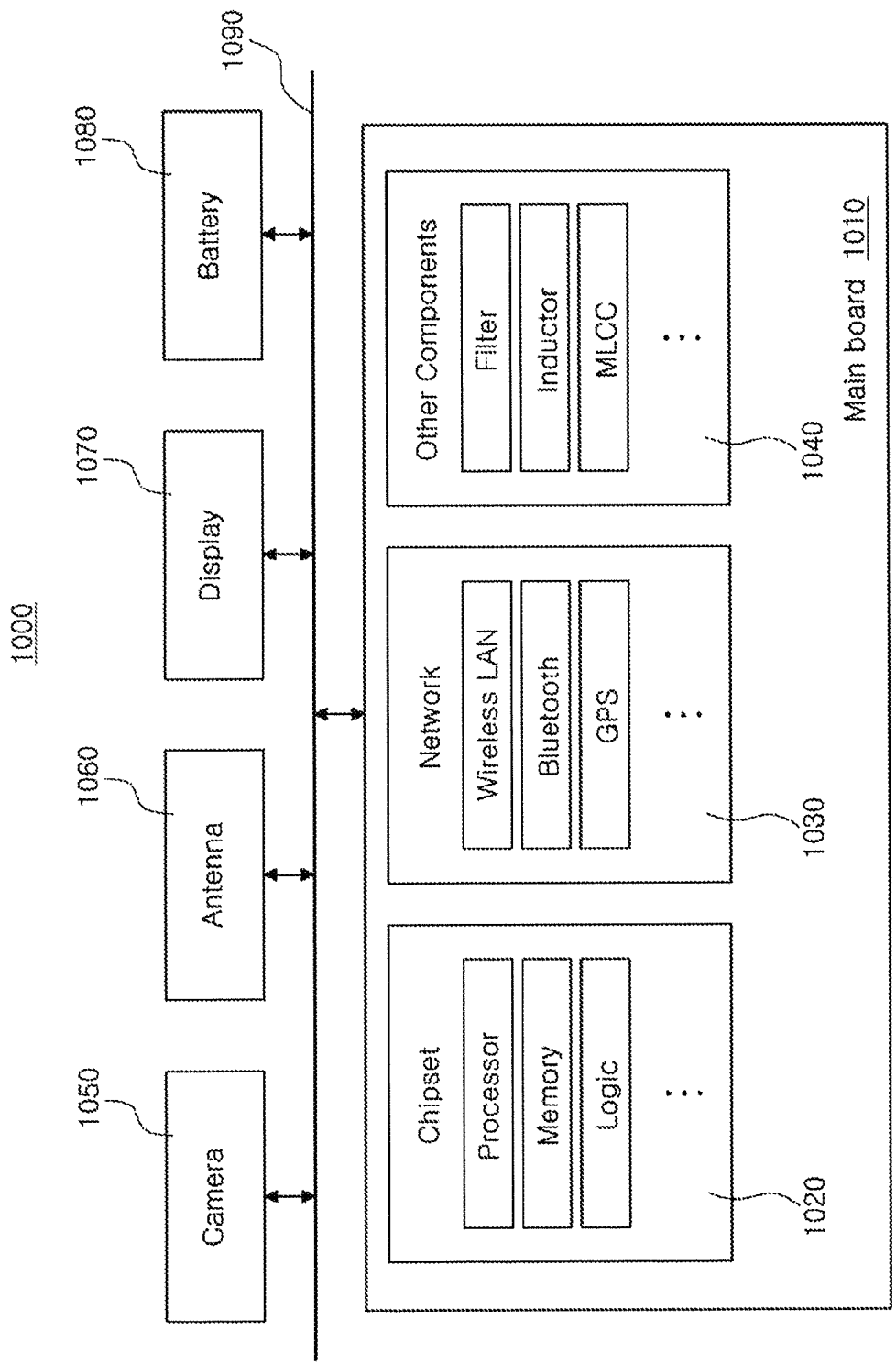
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first interconnection member is disposed at a level higher than a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010. The main board 1010 may include chip-related components 1020, network-related components 1030, other components 1040, and the like, physically or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may include passive components used for various other purposes, or the like. In addition, other components 1040 may be combined with each other, together with the chip-related components 1020 or the network-related components 1030 described above.

Depending on type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may include other components used for various purposes depending on type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
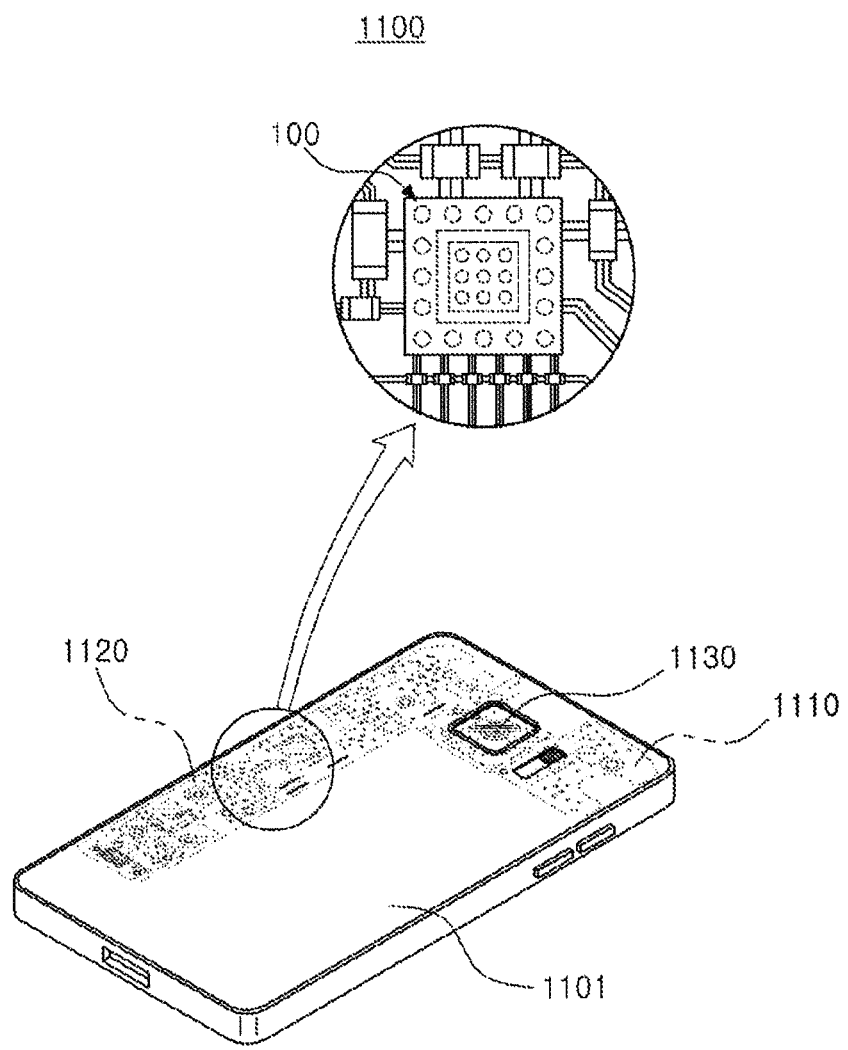
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip-related components 1020, and the semiconductor package 100 may be, for example, an application processor among the chip-related components 1020, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip is not used itself, but is packaged and used in an electronic device, or the like, in a package state.

Semiconductor packaging is required due to a difference in a circuit width existing between the semiconductor chip and a main board of the electronic device with regard to electrical connectivity. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured using packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
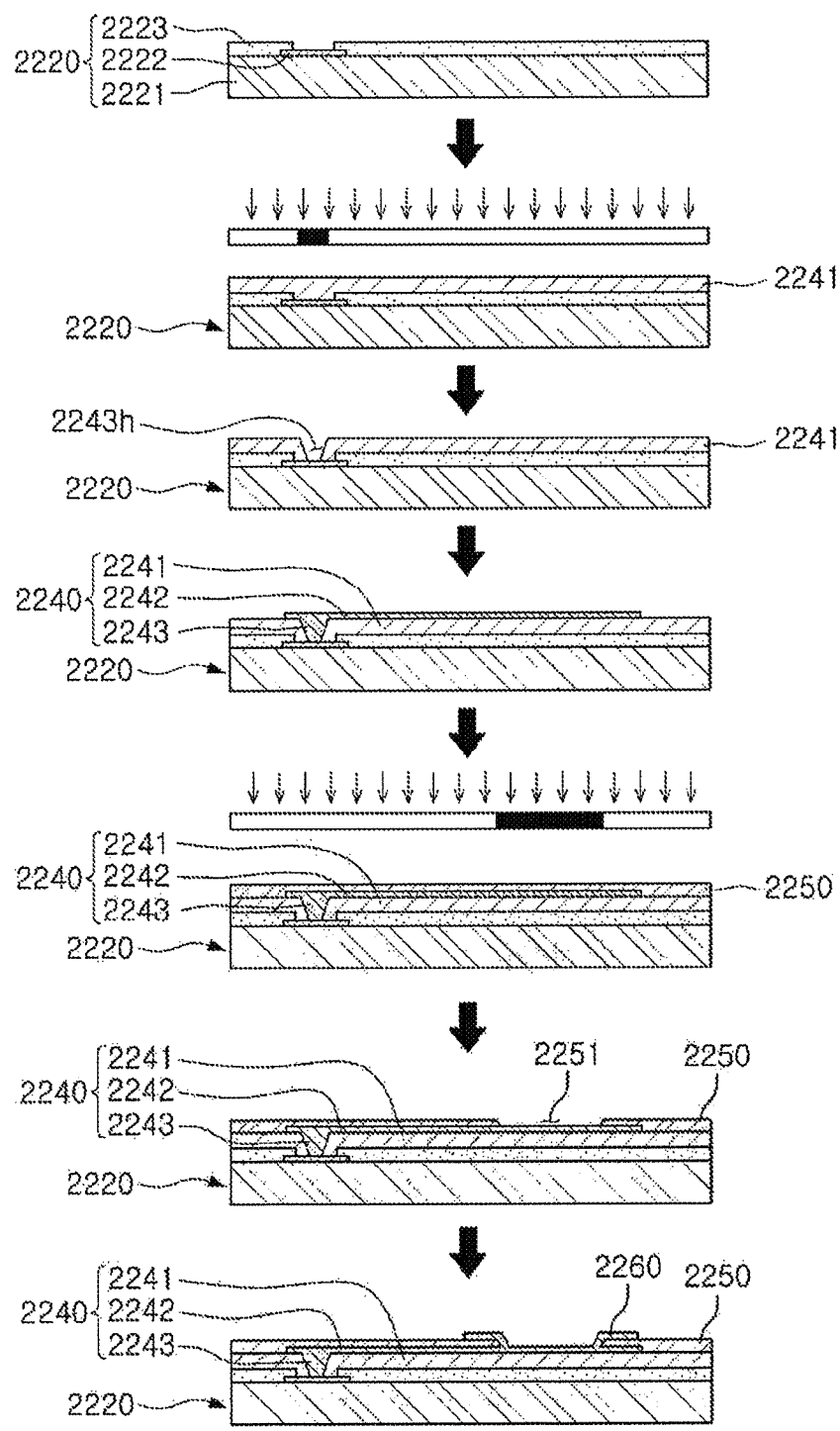
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, depending on a size of the semiconductor chip 2220, an interconnection member 2240 may be formed on the semiconductor chip 2220 in order to redistribute the connection pads 2222. The interconnection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads of the semiconductor chip, input/output (I/O) terminals for example, are disposed inside the semiconductor chip, may have excellent electrical characteristics and may be produced at low cost. Therefore, many elements mounted in a smartphone have been manufactured in fan-in semiconductor package form. In detail, many elements mounted in the smartphone have been developed to allow for rapid signal transfer while having a compact size.

However, since all of the I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
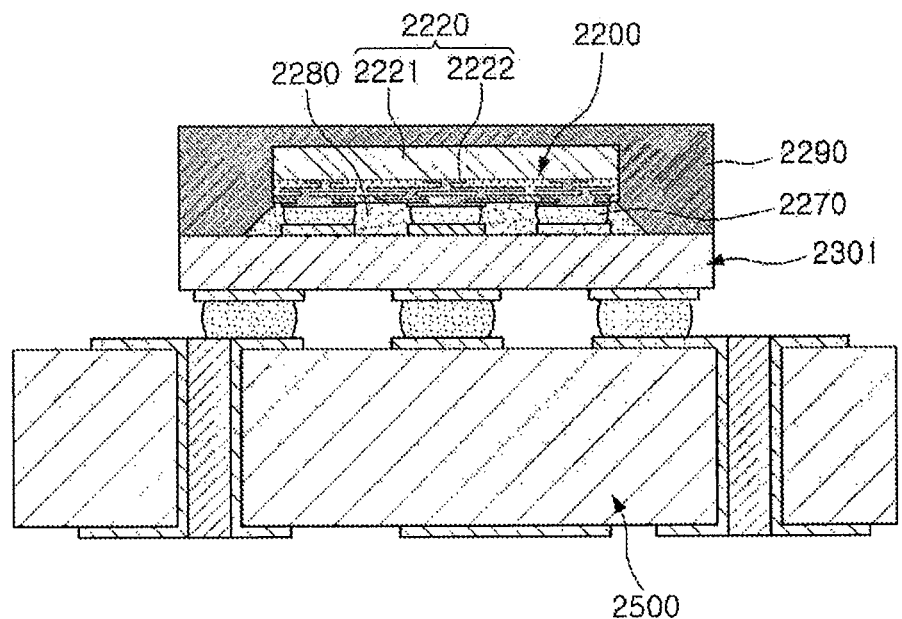
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
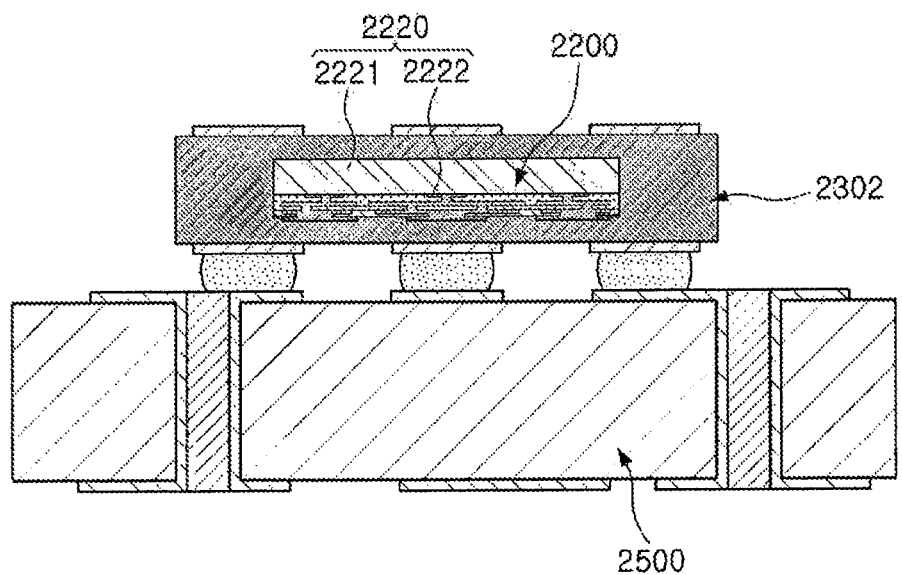
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. Here, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and may then be mounted on the main board of the electronic device through a packaging process or may be mounted and used on the main board of the electronic device in a state in which it is embedded in the interposer substrate.

Fan-Out Semiconductor Package

Figure 7:
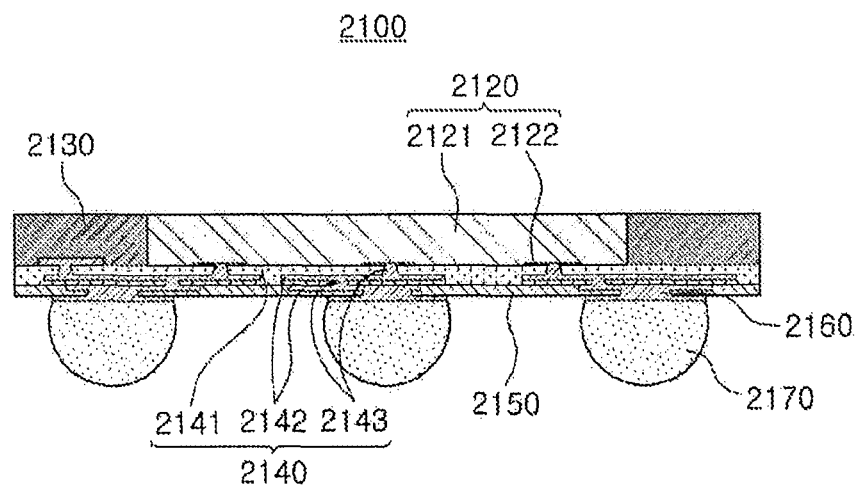
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
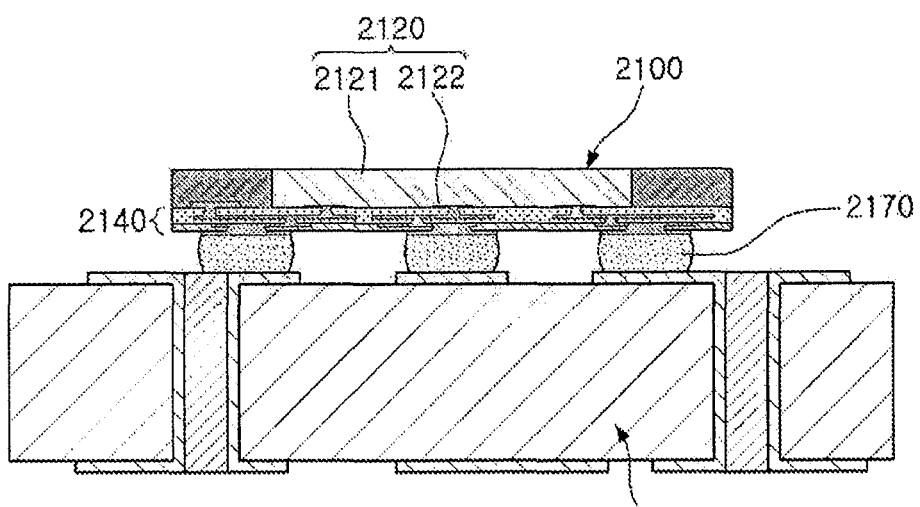
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and which is conceptually different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which corrosion of a connection pad that may occur due to various causes may be prevented will hereinafter be described with reference to the drawings.

Figure 9:
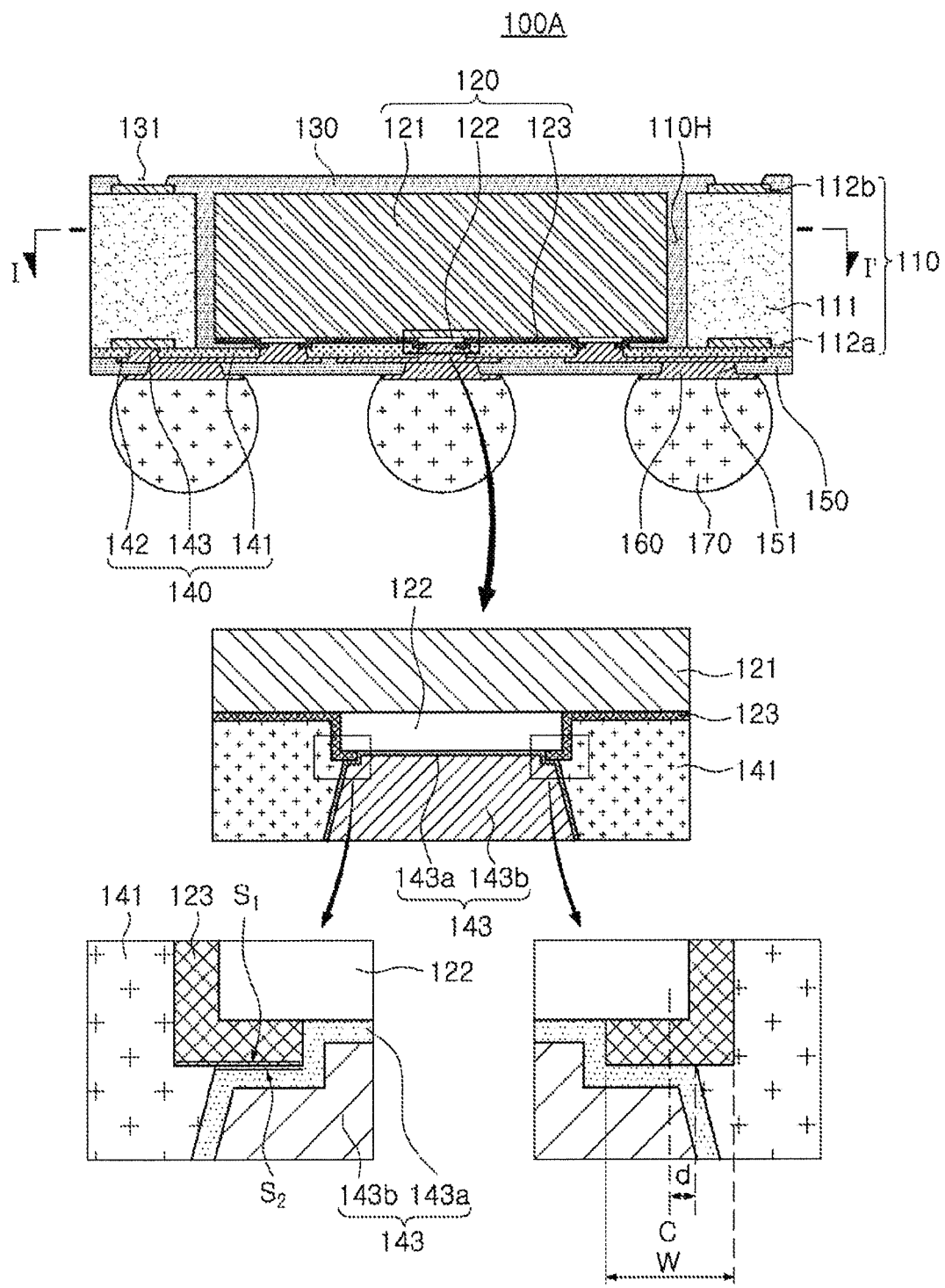
FIG. 9 is a schematic cross-sectional view illustrating an example of a fan-out semiconductor package.

FIG. 9 is a schematic cross-sectional view illustrating an example of a fan-out semiconductor package.

Figure 10:
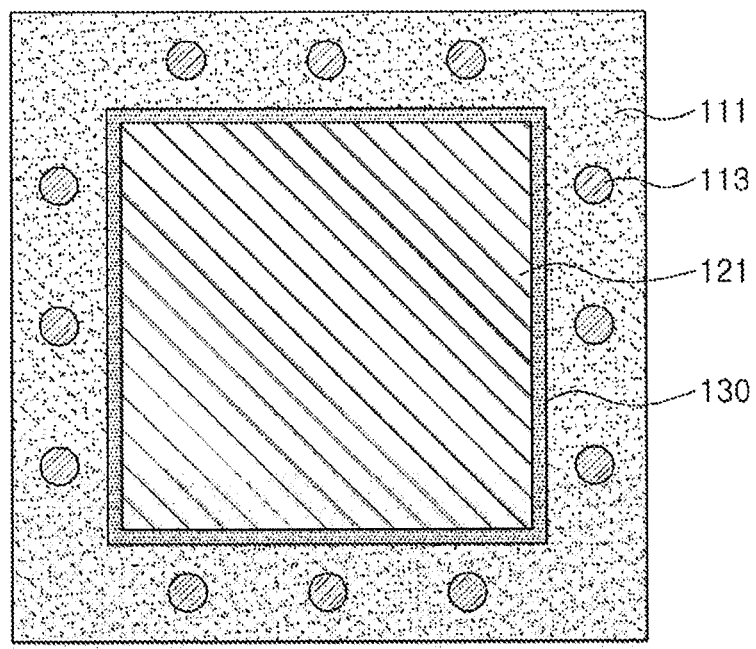
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an underbump metal layer 160 disposed in openings 151 of the passivation layer 150, and connection terminals 170 formed on the underbump metal layer 160. The semiconductor chip 120 may include a passivation layer 123 having openings exposing at least portions of the connection pads 122. The connection pads 122 may be connected to a redistribution layer 142 through vias 143 of the second interconnection member 140. In this case, the via 143 may lie over at least portions of the passivation layer 123. Therefore, the entirety of a surface of the connection pad 122 exposed by the opening of the passivation layer 123 may be covered with the via 143. That is, the connection pad 122 may not contact an insulating layer 141.

Generally, a semiconductor package may be manufactured by a traditional packaging method of mounting a chip in which circuits are formed on a silicon wafer in a pre-process on a lead frame substrate in a post-process and then molding the chip. However, recently, fan-out packaging technology of first molding a chip and directly forming fine circuits in a region including a molding region without using the lead frame substrate has become prominent. The fan-out packaging technology refers to a technology of first performing molding on the chip in a state in which connection pads of the chip are exposed to extend regions in which fine circuits and connection terminals are formed up to the molding region, and may secure inputs/outputs corresponding to the number required for mounting and spaces required for intervals using cheap package molding. Therefore, the chip may be embedded in an ultra-miniaturized/high integrated expensive silicon wafer to secure connectivity to a board, the lead frame substrate is not used, such that a cost may be reduced, and a wiring distance may be shortened, such that inductance and power consumption may be reduced.

As a technology refining a silicon pre-process of a semiconductor industry substantially arrives at a physical limitation, development of cheap chip packaging technology including a fan-out wafer level package has been accelerated due to a limitation in miniaturization of a silicon wafer and a burden of investment in extreme ultra-violet (EUV) lithography technology, which is a new exposure method. However, due to decreased reliability of dropping and acceleration in a board mounting process caused by a concentration of stress on minute portions depending on thinness of layers formed of the respective materials, the chip packaging technology has not been used for mass production for a long time. In order to improve the reliability in the board mounting process, an underfill method in which a space between connection terminals connecting a package and a board to each other is filled with a bonding resin after the package is mounted on the board may be considered.

Figure 14:
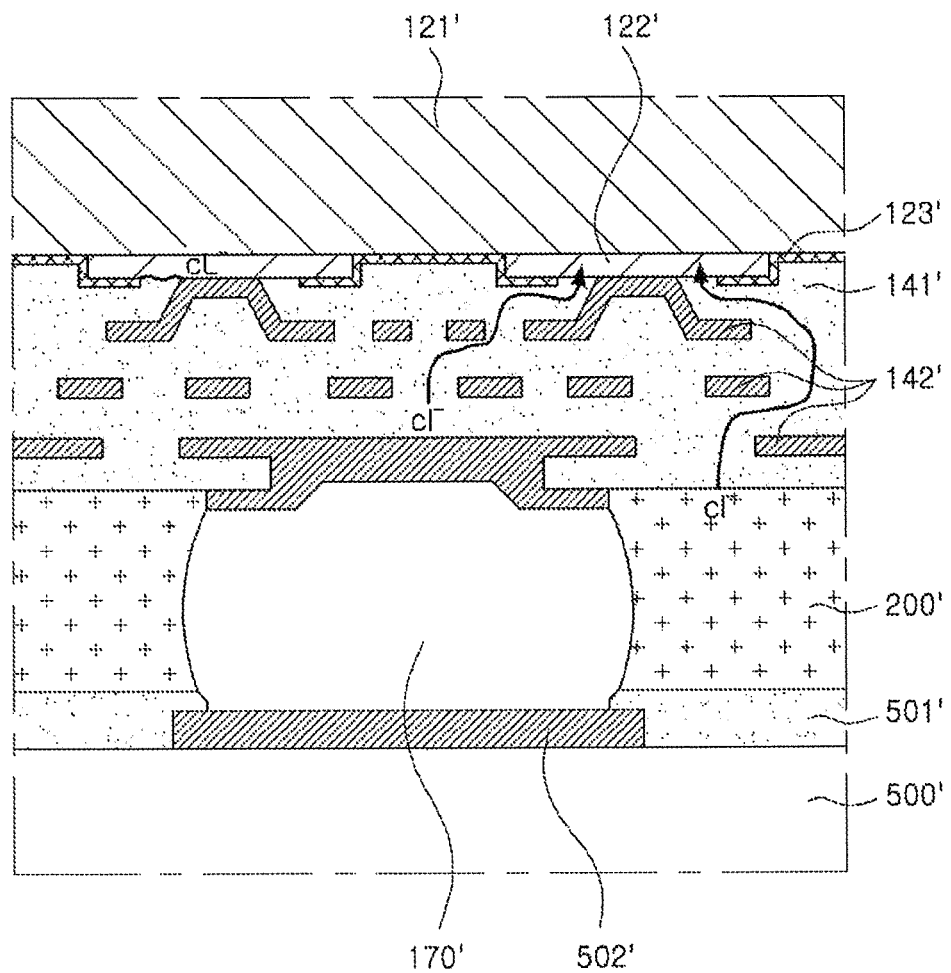
FIG. 14 is a schematic view illustrating a case in which corrosion occurs on a connection pad.
Figure 15:
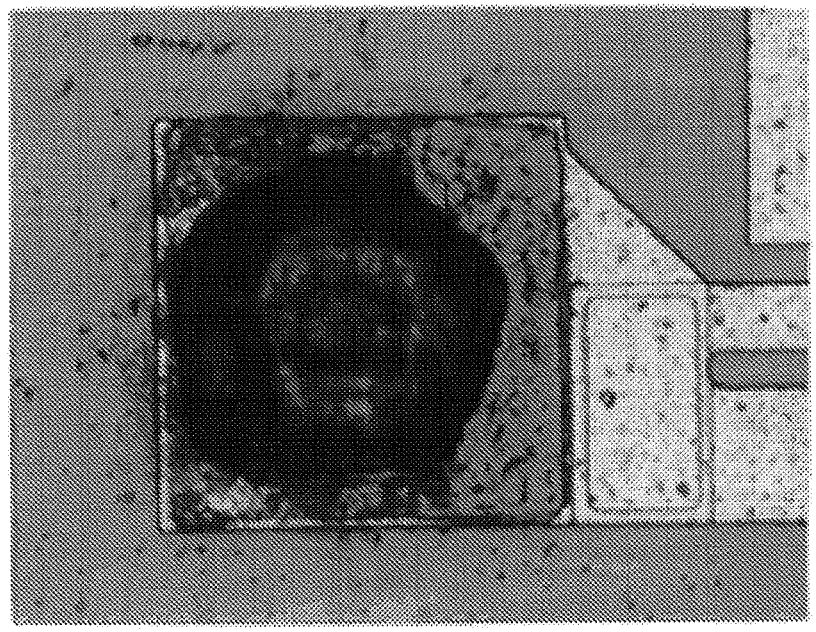
FIG. 15 is a schematic view illustrating corrosion of a connection pad in a state in which a voltage is not applied.
Figure 16:
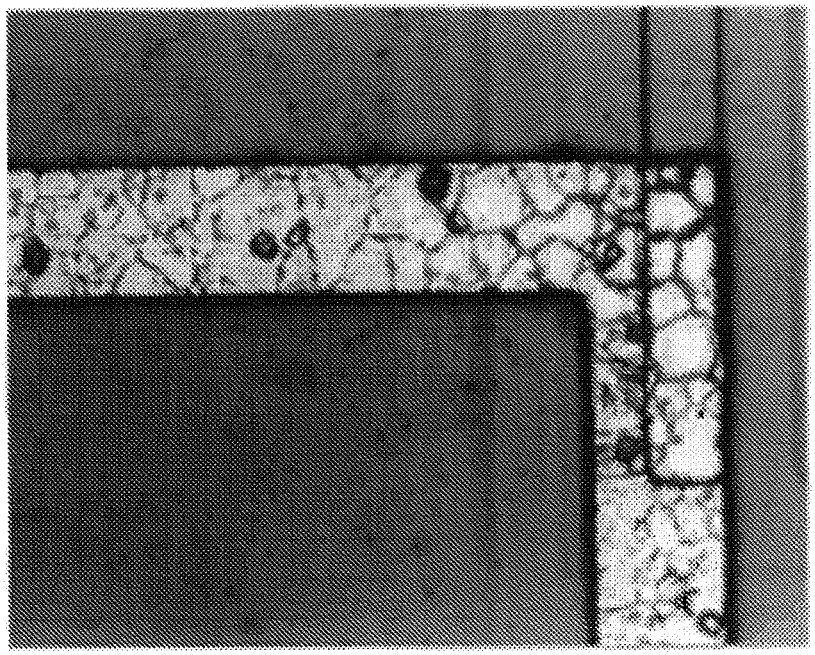
FIG. 16 is a schematic view illustrating corrosion of a connection pad in a state in which a voltage is applied.

However, in the underfill method, a material that may be reworked needs to be used in order to secure a process property, and this material includes a considerable concentration or more of $Cl^-$ ions. The $Cl^-$ ions included in an underfill may be diffused to a polymer insulating layer 141' in a temperature humidity bias (THB) to arrive at a connection pad 122', as illustrated in FIG. 14. The $Cl^-$ ions arriving at the connection pad 122' as described above may cause corrosion of the connection pad of a semiconductor chip in both of a state in which a voltage is not applied and a state in which a voltage is applied, as illustrated in FIGS. 15 and 16. In order to prevent the corrosion of the connection pad due to the $Cl^-$ ions, a decrease in the $C^-$ ions within the underfill, insertion of a $Cl^-$ ion trap layer, addition of a dummy electrode, or the like, may be considered. However, the decrease in the $Cl^-$ ions within the underfill deteriorates a reworking property, and the $Cl^-$ ion trap layer requires an inorganic filler, and thus, it is difficult to insert the $Cl^-$ ion trap layer into an insulating layer on which a fine pattern should be implemented. In addition, the insertion of the dummy electrode decreases only a corrosion speed of the connection pad. Therefore, the insertion of the dummy electrode is not a basic countermeasure in securing a temperature humidity condition performed for a long time.

On the other hand, in a case in which the via 143 of the second interconnection member 140 is formed to lie over at least portions of the passivation layer 123 so that the connection pad 122 does not contact the insulating layer 141, that is, so as to block a path through which the connection pad 122 is exposed to ions, as in the fan-out semiconductor package 100A according to the exemplary embodiment, introduction of the ions into the connection pad 122 may be effectively blocked. Resultantly, the corrosion of the connection pad 122 of the semiconductor chip 120 as described above that may occur due to various causes in the temperature humidity bias (THB) may be prevented.

When a width of a surface of the passivation layer 123 contacting the via 143 while surrounding the opening of the passivation layer 123 is W and a distance by which an edge of the via 143 contacting the passivation layer 123 is spaced apart from a central line C of the surface of the passivation layer 123 contacting the via 143 while surrounding the opening of the passivation layer 123 is d, d/W may be less than or equal to 0.3. Here, d may be a spaced distance in an inward direction ($d_1$) or an outward direction ($d_2$). In a case in which the via 143 is formed so that the edge of the via 143 is positioned to be spaced apart from inner and outer edges of the passivation layer 123 by 20% or more as described above, the via 143 may be stable in terms of stress. In a case in which the edge of the via 143 is positioned in the vicinity of the edges of the passivation layer 123, stress applied to the passivation layer 123 is increased, such that a T/C reliability issue may occur.

When an entire area of the surface of the passivation layer 123 contacting the via 143 while surrounding the opening of the passivation layer 123 is $S_1$ and an area of the via 143 covering the passivation layer 123 is $S_2$, $S_2/S_1$ may be within a range of about 0.2 to 0.8. Similarly, in the case in which the via 143 is formed so that the edge of the via 143 is positioned to be spaced apart from the inner and outer edges of the passivation layer 123 by 20% or more, the via 143 may be stable in terms of stress. Therefore, the area of the via 143 covering the passivation layer 123 may be about 20% to 80% of the entire area, and the via 143 may be most stable in terms of stress in this range.

Meanwhile, the via may be a filled via. In a case in which the via is the filled via as described above, a metal proportion is increased, such that the via may be more stable in terms of stress and may more effectively block introduction of the ions.

The respective components included in the fan-out semiconductor package 100A according to the exemplary embodiment will hereinafter be described in more detail.

The first interconnection member 110 may include redistribution layers 112a and 112b redistributing the connection pads 122 to thus reduce the number of layers of the second interconnection member 140. If necessary, the first interconnection member 110 may maintain rigidity of the fan-out semiconductor package 100A depending on materials, and serve to secure uniformity of a thickness of the encapsulant 130. In some cases, due to the first interconnection member 110, the fan-out semiconductor package 100A according to the exemplary embodiment may be used as a portion of a package-on-package. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and may be variously modified into other forms, and the fan-out semiconductor package 100A may perform another function depending on such a form.

The first interconnection member 110 may include an insulating layer 111 contacting the second interconnection member 140, a first redistribution layer 112a contacting the second interconnection member 140 and embedded in the insulating layer 111, and a second redistribution layer 112b disposed on the other surface of the insulating layer 111 opposing one surface of the insulating layer 111 in which the first redistribution layer 112a is embedded. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122. When the first redistribution layer 112a is embedded in the insulating layer 111, a step generated due to a thickness of the first redistribution layer 112a may be significantly reduced, and an insulating distance of the second interconnection member 140 may thus become constant. That is, a difference between a distance from the redistribution layer 142 of the second interconnection member 140 to a lower surface of the insulating layer 111 and a distance from the redistribution layer 142 of the second interconnection member 140 to the connection pads 122 may be smaller than a thickness of the first redistribution layer 112a. Therefore, a high density wiring design of the second interconnection member 140 may be easy.

A material of the insulating layer 111 is not particularly limited. For example, an insulating material may be used as a material of the insulating layer 111. In this case, a thermosetting resin such as an epoxy resin, a thermoplastic resin such as a polyimide resin, a resin in which the thermosetting resin or the thermoplastic resin is impregnated with an inorganic filler in a core material such as a glass cloth (or a glass fabric), for example, prepreg, Ajinomoto Build up Film (ABF), FR-4, Bismaleimide Triazine (BT), or the like, may be used as the insulating material. Alternatively, a photoimagable dielectric (PID) resin may also be used as the insulating material.

The redistribution layers 112a and 112b may serve to redistribute the connection pads 122 of the semiconductor chip 120, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a and 112b. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, connection terminal pads, and the like. As a non-restrictive example, both of the redistribution layers 112a and 112b may include ground patterns. In this case, the number of ground patterns formed on the redistribution layers 142 of the second interconnection member 140 may be significantly reduced, such that a degree of wiring design freedom may be improved.

A surface treatment layer (not illustrated) may further be formed on some of patterns of the redistribution layer 112b exposed from the redistribution layers 112a and 112b through openings 131, if necessary. The surface treatment layer (not illustrated) is not particularly limited as long as it is known in the related art, and may be formed by using, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like.

The vias 113 may electrically connect the redistribution layers 112a and 112b formed on different layers, resulting in an electrical path in the first interconnection member 110. A conductive material may also be used as a material of each of the vias 113. Each of the vias 113 may be entirely filled with the conductive material, as illustrated in FIG. 10, or the conductive material may also be formed along a wall of each of via holes. In addition, each of the vias 113 may have all of the shapes known in the related art, such as a tapered shape, a cylindrical shape, and the like.

The semiconductor chip 120 may be an integrated circuit (IC) provided in an amount of several hundreds to several millions of elements or more integrated in a single chip. The IC may be, for example, an application processor chip such as a central processor (for example, a CPU), a graphic processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components, and a conductive material such as aluminum (Al), or the like, may be used as a material of each of the connection pads 122. The passivation layer 123 having the openings exposing the connection pads 122 may be formed on the body 121, and may be formed of, for example, an oxide film formed of SiO, etc., a nitride film formed of SiN, etc., or the like, or be formed of a double layer including an oxide film and a nitride film. A lower surface of the connection pad 122 may have a step with respect to a lower surface of the encapsulant 130 through the passivation layer 123. Resultantly, a phenomenon in which the encapsulant 130 is bled to the lower surface of the connection pad 122 may be prevented to some degree. An insulating layer (not illustrated), and the like, may also be further disposed at other required positions.

The inactive surface of the semiconductor chip 120 may be disposed on a level below an upper surface of the second redistribution layer 112b of the first interconnection member 110. For example, the inactive surface of the semiconductor chip 120 may be disposed on a level below an upper surface of the insulating layer 111 of the first interconnection member 110. A height difference between the inactive surface of the semiconductor chip 120 and the upper surface of the second redistribution layer 112b of the first interconnection member 110 may be 2 μm or more, for example, 5 μm or more. In this case, generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The encapsulant 130 may protect the first interconnection member 110 or the semiconductor chip 120. An encapsulation form of the encapsulant 130 is not particularly limited, but may be a form in which the encapsulant 130 surrounds at least portions of the first interconnection member 110 or the semiconductor chip 120. For example, the encapsulant 130 may cover the first interconnection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120.

Materials of the encapsulant 130 are not particularly limited. For example, an insulating material may be used as the materials of the encapsulant 130. In this case, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like, may be used as the insulating material. In addition, the known molding material such as an EMC, or the like, may also be used. Alternatively, a resin in which a thermosetting resin or a thermoplastic resin is impregnated with an inorganic filler in a core material such as a glass cloth (or a glass fabric) may also be used as the insulating material.

The encapsulant 130 may include a plurality of layers formed of a plurality of materials. For example, a space within the through-hole 110H may be filled with a first encapsulant, and the first interconnection member 110 and the semiconductor chip 120 may be covered with a second encapsulant. Alternatively, the first encapsulant may cover the first interconnection member 110 and the semiconductor chip 120 at a predetermined thickness while filling the space within the through-hole 110H, and the second encapsulant may again cover the first encapsulant at a predetermined thickness. In addition to the form described above, various forms may be used.

The encapsulant 130 may include conductive particles in order to block electromagnetic waves, if necessary. For example, the conductive particles may be any material that may block electromagnetic waves, such as copper (Cu), aluminum (Al), silver (Ag), tin (Sn), gold (Au), nickel (Ni), lead (Pb), titanium (Ti), a solder, or the like. However, this is only an example, and the conductive particles are not limited thereto.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through the connection terminals 170 depending on the functions. The second interconnection member 140 may include insulating layers 141, redistribution layers 142 disposed on the insulating layers 141, and vias 143 penetrating through the insulating layers 141 and connecting the redistribution layers 142 to each other. The second interconnection member 140 may be formed of a single layer or may be formed of a plurality of layers unlike the drawings.

An insulating material may be used as a material of each of the insulating layers 141. In this case, in addition to the insulating material as described above, a photosensitive insulating material such as a PID resin may also be used as the insulating material. In this case, the insulating layer 141 may be formed to have a smaller thickness, and a fine pitch of the vias 143 may be achieved more easily. When the insulating layers 141 are multiple layers, materials of the respective insulating layers 141 may be the same as each other, and may also be different from each other. When the insulating layers 141 are multiple layers, the insulating layers 141 may be integrated with each other, such that boundaries therebetween may not be readily apparent.

The redistribution layers 142 may substantially serve to redistribute the connection pads 122, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 142. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

A surface treatment layer (not illustrated) may further be formed on some of patterns exposed from the redistribution layers 142, if necessary. The surface treatment layer (not illustrated) are not particularly limited as long as they are known in the related art, and may be formed by, for example, electrolytic gold plating, electroless gold plating, OSP or electroless tin plating, electroless silver plating, electroless nickel plating/substituted gold plating, DIG plating, HASL, or the like.

The vias 143 may electrically connect the redistribution layers 142, the connection pads 122, or the like, formed on different layers, resulting in an electrical path in the fan-out semiconductor package 100A. A conductive material such as copper (Cu), aluminum (Al), silver (Ag), tin (Sn), gold (Au), nickel (Ni), lead (Pb), titanium (Ti), or alloys thereof, may be used as a material of each of the vias 143. The via 143 may lie over at least portions of the passivation layer 123, and cover the entirety of the exposed surface of the connection pad 122. The via 143 may be the filled via, but is not limited thereto. The via 143 may have a tapered shape of which a diameter is reduced toward the connection pad 122, but is not limited thereto.

The via 143 may include a seed layer 143a and a conductor layer 143b. The seed layer 143a may be formed on the exposed surface of the connection pad 122, a wall of the passivation layer 123, a surface of the passivation layer 123, and a wall of a via hole penetrating through the insulating layer 141. The conductor layer 143b may be formed on the seed layer 143a, and fill the via hole. The seed layer 143a may include a first seed layer including one or more selected from the group consisting of titanium (Ti), titanium-tungsten (Ti—W), molybdenum (Mo), chromium (Cr), nickel (Ni), and nickel-chromium (Ni—Cr) and a second seed layer disposed on the first seed layer and including the same material as that of the conductor layer 143b, such as copper (Cu). The first seed layer may serve as an adhesive, and the second seed layer may serve as a basic plating layer. The conductor layer 143b may include a conductive material such as copper (Cu), aluminum (Al), silver (Ag), tin (Sn), gold (Au), nickel (Ni), lead (Pb), or alloys thereof, and may generally include copper (Cu).

When the width of the surface of the passivation layer 123 contacting the via 143 while surrounding the opening of the passivation layer 123 is W and the distance by which the edge of the via 143 contacting the passivation layer 123 is spaced apart from the central line C of the surface of the passivation layer 123 contacting the via 143 while surrounding the opening of the passivation layer 123 is d, d/W may be less than or equal to 0.3. Here, d may be the spaced distance in an inward direction ($d_1$) or an outward direction ($d_2$). In the case in which the via 143 is formed so that the edge of the via 143 is positioned to be spaced apart from the inner and outer edges of the passivation layer 123 by 20% or more as described above, the via 143 may be stable in terms of stress. In the case in which the edge of the via 143 is positioned in the vicinity of the edges of the passivation layer 123, the stress applied to the passivation layer 123 is increased, such that the T/C reliability issue may occur.

When the entire area of the surface of the passivation layer 123 contacting the via 143 while surrounding the opening of the passivation layer 123 is $S_1$ and the area of the via 143 covering the passivation layer 123 is $S_2$, $S_2/S_1$ may be within a range of about 0.2 to 0.8. Similarly, in the case in which the via 143 is formed so that the edge of the via 143 is positioned to be spaced apart from the inner and outer edges of the passivation layer 123 by 20% or more, the via 143 may be stable in terms of stress. Therefore, the area of the via 143 covering the passivation layer 123 may be about 20% to 80% of the entire area, and the via 143 may be most stable in terms of stress in this range.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the semiconductor chip 120, the redistribution layers 112a and 112b formed in the first interconnection member 110 may be formed to be relatively large, depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may be configured to protect the second interconnection member 140 from external physical or chemical damage. The passivation layer 150 may have the openings 151 exposing at least portions of one of the redistribution layers 142 of the second interconnection member 140. The openings 151 may expose the entirety or only a portion of a surface of the redistribution layer 142. In some cases, each of the openings 151 may expose a side surface of the redistribution layer 142.

A material of the passivation layer 150 is not particularly limited, and may be, for example, a photosensitive insulating material. Alternatively, a solder resist may also be used as a material of the passivation layer 150. Alternatively, an insulating resin that does not include a core material, but includes a filler, for example, ABF including an inorganic filler and an epoxy resin, or the like, may be used as the material of the passivation layer 150. A surface roughness of the passivation layer 150 may be lower as compared to a general case. When the surface roughness is low as described above, several side effects that may ensue in a circuit forming process, such as generation of a stain on a surface, difficulty in implementing a fine circuit, and the like, may be improved.

The underbump metal layer 160 may additionally be configured to improve connection reliability of the connection terminals 170 to improve board level reliability. The underbump metal layer 160 may fill at least portions of the openings 151. The underbump metal layer 160 may be formed by the known metallization method. The underbump metal layer 160 may include the known metal. The underbump metal layer 160 may be formed by forming a seed layer by electro copper plating and forming a plating layer on the seed layer by electroless copper plating.

The connection terminals 170 may additionally be configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material such as a solder, or the like. However, this is only an example, and a material of each of the connection terminals 170 is not limited thereto. Each of the connection terminals 170 may be a land, a ball, a pin, or the like. The connection terminal 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto. The number, an interval, a disposition form, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, unlike a ball grid array (BGA) package, a land grid array (LGA) package, or the like, the fan-out package may be mounted on an electronic device without a separate board. Thus, the fan-out package may be thinned, and may have price competitiveness.

Although not illustrated in the drawings, a metal layer may be further disposed on an inner wall of the through-hole 110H of the first interconnection member 110, if necessary. That is, the side surfaces of the semiconductor chip 120 may also be surrounded by the metal layer. Heat generated from the semiconductor chip 120 may be effectively radiated in an upward or downward direction of the fan-out semiconductor package 100A through the metal layer, and an electromagnetic wave may be effectively blocked through the metal layer. In addition, if necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components may be encapsulated together with the semiconductor chip in the through-hole 110H. In addition, a surface mount technology (SMT) component may be mounted on the passivation layer 150.

Figure 11:
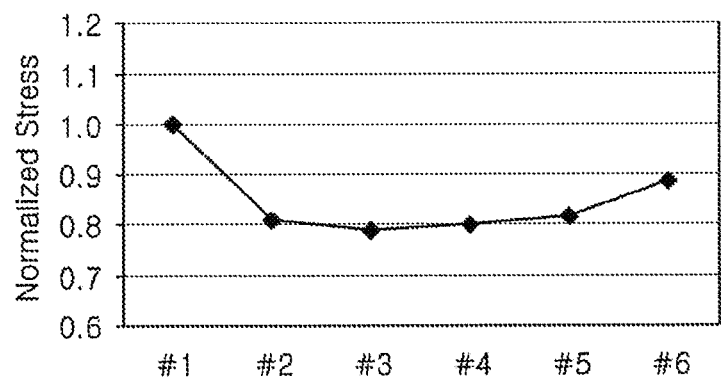
FIG. 11 is a graph schematically illustrating a change in stress depending on a position in which a via of a second interconnection member of the fan-out semiconductor package of FIG. 9 covers a passivation layer of a semiconductor chip.

FIG. 11 is a graph schematically illustrating a change in stress depending on a position in which a via of a second interconnection member of the fan-out semiconductor package of FIG. 9 covers a passivation layer of a semiconductor chip.

Referring to the drawing, #1 refers to a T/C reliability test result in a case (less than 20%) in which the edge of the via 143 is substantially close to the inner edge of the surface of the passivation layer 123 contacting the via 143, that is, in a case in which the area $S_2$ of the via 143 covering the passivation layer 123 is less than 20% of the entire area $S_1$ of the surface of the passivation layer 123 contacting the via 143, #2 to #5 refer to a T/C reliability test result in a case (a spaced distance is within 30%) in which the edge of the via 143 is positioned in the vicinity of the central line C of the surface of the passivation layer 123 contacting the via 143, that is, in a case in which the area $S_2$ of the via 143 covering the passivation layer 123 corresponds to 20% to 80% of the entire area $S_1$ of the surface of the passivation layer 123 contacting the via 143, and #6 refers to a T/C reliability test result in a case (less than 20%) in which the edge of the via 143 is substantially close to the outer edge of the surface of the passivation layer 123 contacting the via 143, that is, in a case in which the area $S_2$ of the via 143 covering the passivation layer 123 exceeds 80% of the entire area $S_1$ of the surface of the passivation layer 123 contacting the via 143.

Therefore, it may be appreciated that when the width of the surface of the passivation layer 123 contacting the via 143 while surrounding the opening of the passivation layer 123 is W and the distance by which the edge of the via 143 contacting the passivation layer 123 is spaced apart from the central line C of the surface of the passivation layer 123 contacting the via 143 while surrounding the opening of the passivation layer 123 is d, the via 143 may be stable in terms of stress in a case in which d/W is within 0.3. In addition, it may be appreciated that when the entire area of the surface of the passivation layer 123 contacting the via 143 while surrounding the opening of the passivation layer 123 is $S_1$ and the area of the via 143 covering the passivation layer 123 is $S_2$, the via 143 may be stable in terms of stress in a case in which $S_2/S_1$ is within a range of about 0.2 to 0.8.

Figure 12:
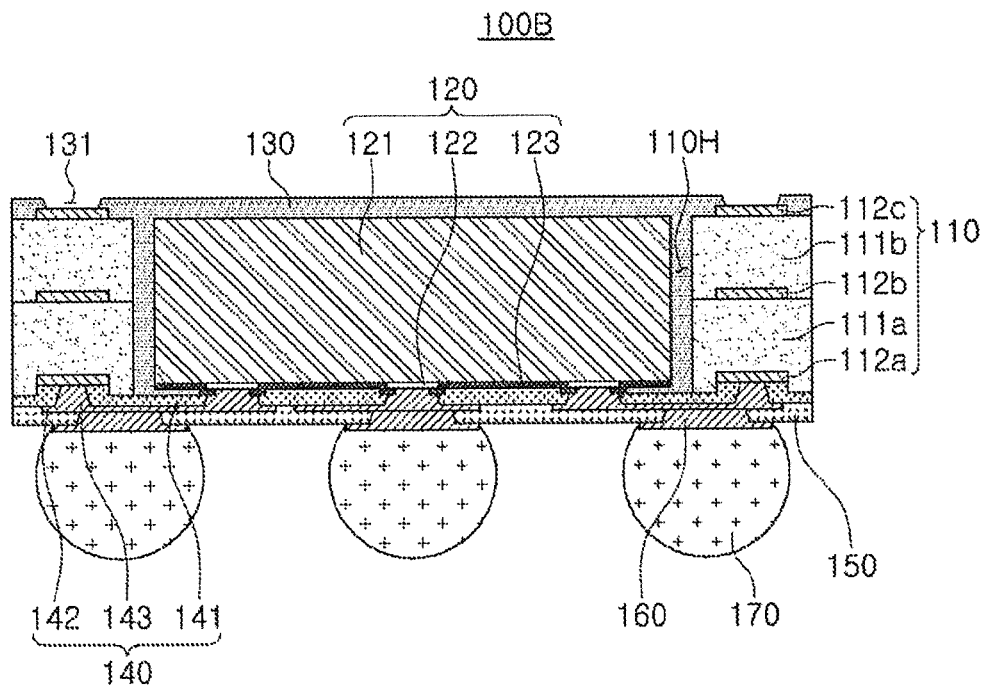
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100B according to another exemplary embodiment in the present disclosure, a first interconnection member 110 may include a first insulating layer 111a contacting a second interconnection member 140, a first redistribution layer 112a contacting the second interconnection member 140 and embedded in a first surface of the first insulating layer 111a, a second redistribution layer 112b disposed on a second surface of the first insulating layer 111a opposing the first surface of the first insulating layer 111a, a second insulating layer Mb disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, the first and second redistribution layers 112a and 112b and the second and third redistribution layers 112b and 112c may be electrically connected to each other through first and second vias (not illustrated) penetrating through the first and second insulating layers 111a and 111b, respectively.

Since the first redistribution layer 112a is embedded in the first insulating layer 111a, an insulating distance of an insulating layer 141 of the second interconnection member 140 may be substantially constant, as described above. Since the first interconnection member 110 may include a large number of redistribution layers 112a, 112b, and 112c, the second interconnection member 140 may be further simplified. Therefore, a decrease in yield depending on a defect occurring in a process of forming the second interconnection member 140 may be improved. The first redistribution layer 112a may be recessed in the first insulating layer 111a, such that a lower surface of the first insulating layer 111a may have a step with respect to a lower surface of the first redistribution layer 112a. Resultantly, when an encapsulant 130 is formed, a phenomenon in which a material of the encapsulant 130 is bled, polluting the first redistribution layer 112a, may be prevented.

The lower surface of the first redistribution layer 112a of the first interconnection member 110 may be disposed on a level higher than a lower surface of the connection pad 122 of the semiconductor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pads 122 of the semiconductor chip 120. The reason is that the first redistribution layer 112a may be recessed in the first insulating layer 111a. The second redistribution layer 112b of the first interconnection member 110 may be disposed on a level between an active surface and an inactive surface of the semiconductor chip 120. The first interconnection member 110 may be formed at a thickness corresponding to that of the semiconductor chip 120. Therefore, the second redistribution layer 112b formed in the first interconnection member 110 may be disposed on a level between the active surface and the inactive surface of the semiconductor chip 120.

Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, and 112c may be formed to be relatively large, depending on a scale of the first interconnection member 110. On the other hand, the redistribution layer 142 of the second interconnection member 140 may be formed to be relatively small, for thinness.

Descriptions of configurations overlapping the previously described configuration will be omitted.

Figure 13:
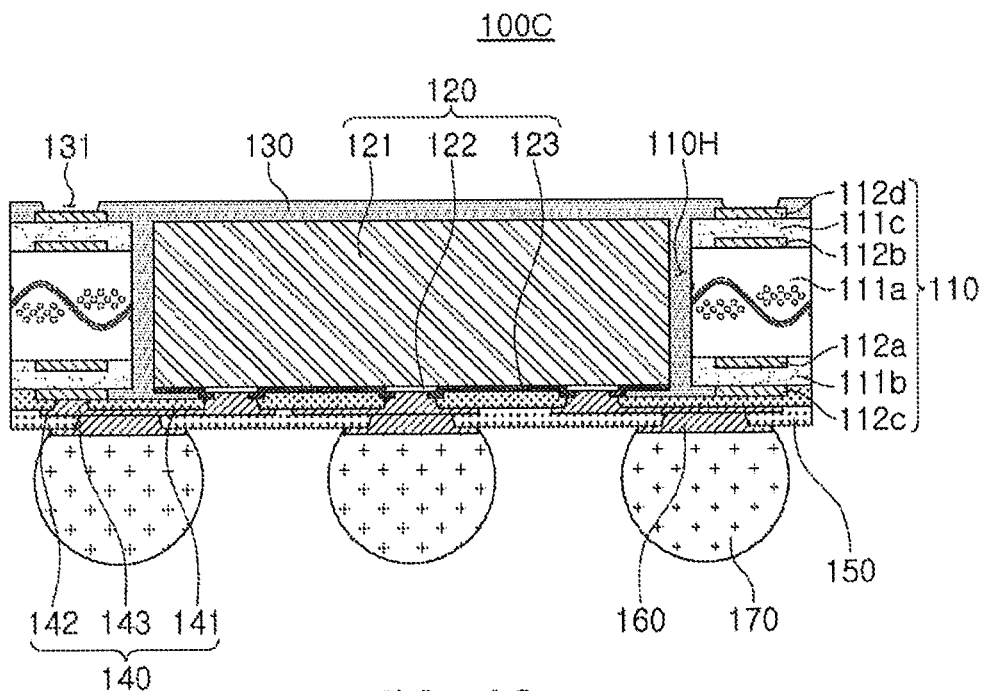
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100C according to another exemplary embodiment in the present disclosure, a first interconnection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first interconnection member 110 may include a larger number of redistribution layers 112a, 112b, 112c, and 112d, the second interconnection member 140 may be further simplified, and a decrease in yield due to a defect of the second interconnection member 140 may be improved. Meanwhile, the first to fourth redistribution layers 112a, 112b, 112c, and 112d may be electrically connected to each other through first to third vias each penetrating through the first to third insulating layers 111a, 111b, and 111c.

The first insulating layer 111a may have a thickness greater than those of the second insulating layer 111b and the third insulating layer 111c. The first insulating layer 111a may basically be relatively thick in order to maintain rigidity, and the second and third insulating layers 111b and 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pad 122 of the semiconductor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pad 122 of the semiconductor chip 120. The reason is that the third redistribution layer 112c may be disposed in a protruding form on the second insulating layer 111b, resulting in contacting the second interconnection member 140. The first redistribution layer 112a and the second redistribution layer 112b of the first interconnection member 110 may be disposed on a level between an active surface and an inactive surface of the semiconductor chip 120. The first interconnection member 110 may be formed at a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120.

Thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, 112c, and 112d may also be formed to be relatively large. On the other hand, the redistribution layer 142 of the second interconnection member 140 may be faulted to be relatively small, for thinness.

Descriptions of configurations overlapping the previously described configuration will be omitted.

FIG. 14 is a schematic view illustrating a case in which corrosion occurs on a connection pad.

FIG. 15 is a schematic view illustrating corrosion of a connection pad in a state in which a voltage is not applied.

FIG. 16 is a schematic view illustrating corrosion of a connection pad in a state in which a voltage is applied.

Referring to the drawings, a semiconductor package may be mounted on a board 500' through a connection terminal 170'. The connection terminal 170' may be electrically connected to an electrode 502' exposed from an insulating layer 501' of the board 500'. The connection terminal 170' may be electrically connected to connection pads 122' through redistribution layers 142' formed in a polymer insulating layer 141'. Meanwhile, the connection terminal 170' may be fixed by an underfill 200'. In this case, in a temperature humidity bias (THB), ions such as Cl⁻, or the like, of the underfill 200' may pass through the polymer insulating layer 141' to corrode the connection pad 122' of a semiconductor chip. In detail, in the THB, a surface, exposed from a passivation layer 123' of the connection pad 122' formed on a body 121' of the semiconductor chip, may be corroded by the ions such as Cl⁻, or the like. That is, in a case in which the via 143 is not formed to cover the passivation layer 123 unlike the fan-out semiconductor packages 100A to 100C according to the present disclosure, the connection pad of the semiconductor chip may be corroded in a state in which a voltage is not applied or a state in which a voltage is applied.

As set forth above, according to the exemplary embodiment in the present disclosure, a fan-out semiconductor package in which corrosion of a connection pad that may occur due to various causes may be prevented may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
    a semiconductor chip having an active surface having a connection pad disposed thereon and an inactive surface opposing the active surface;
    an encapsulant encapsulating at least a portion of the inactive surface of the semiconductor chip; and
    a first interconnection member disposed on the active surface of the semiconductor chip,
    wherein the first interconnection member includes a redistribution layer electrically connected to the connection pad,
    the semiconductor chip includes a passivation layer having an opening exposing, at least a portion of, the connection pad,
    the redistribution layer of the first interconnection member is connected to the connection pad through a via,
    the via is disposed on at least a portion of the passivation layer and the connection pad, and
    the passivation layer covers a side surface of the connection pad and a portion of a lower surface of the connection pad, wherein $S_2/S_1$ is within a range of 0.2 to 0.8, where $S_1$ is an entire area of a surface of the passivation layer contacting the via while surrounding the opening of the passivation layer and $S_2$ is an area of the via covering the passivation layer.

2. The fan-out semiconductor package of claim 1, wherein d/W is less than or equal to 0.3, where W is a width of a surface of the passivation layer contacting the via while surrounding the opening of the passivation layer and d is a distance by which an edge of the via contacting the passivation layer is spaced apart from a central line of the surface of the passivation layer contacting the via while surrounding the opening of the passivation layer.

3. The fan-out semiconductor package of claim 1, wherein the via covers an entirety of an exposed surface of the connection pad.

4. The fan-out semiconductor package of claim 1, wherein the via is a filled via.

5. The fan-out semiconductor package of claim 1, further comprising:
    a second interconnection member having a through hole,
    wherein the semiconductor chip is disposed in the through hole of the second interconnection member,
    wherein the second interconnection member includes a first insulating layer, a first redistribution layer contacting the first interconnection member and embedded in a first surface of the first insulating layer, and a second redistribution layer disposed on a second surface of the first insulating layer opposing the first surface of the first insulating layer, and
    the first and second redistribution layers are electrically connected to the connection pad.

6. The fan-out semiconductor package of claim 5, wherein the second interconnection member further includes a second insulating layer disposed on the first insulating layer and covering the second redistribution layer and a third redistribution layer disposed on the second insulating layer, and
the third redistribution layer is electrically connected to the connection pad.

7. The fan-out semiconductor package of claim 6, wherein the second redistribution layer is disposed on a level between the active surface and the inactive surface of the semiconductor chip.

8. The fan-out semiconductor package of claim 5, wherein a distance between the redistribution layer of the first interconnection member and the first redistribution layer is greater than that between the redistribution layer of the first interconnection member and the connection pad.

9. The fan-out semiconductor package of claim 5, wherein the first redistribution layer has a thickness greater than that of the redistribution layer of the first interconnection member.

10. The fan-out semiconductor package of claim 5, wherein a lower surface of the first redistribution layer is disposed on a level higher than a lower surface of the connection pad.

11. The fan-out semiconductor package of claim 1, further comprising:
a second interconnection member having a through hole, wherein the semiconductor chip is disposed in the through hole of the second interconnection member,
wherein the second interconnection member includes a first insulating layer, a first redistribution layer and a second redistribution layer disposed on opposing surfaces of the first insulating layer, respectively, a second insulating layer disposed on the first insulating layer and covering the first redistribution layer, and a third redistribution layer disposed on the second insulating layer, and
the first to third redistribution layers are electrically connected to the connection pad.

12. The fan-out semiconductor package of claim 11, wherein the second interconnection member further includes a third insulating layer disposed on the first insulating layer and covering the second redistribution layer and a fourth redistribution layer disposed on the third insulating layer, and
the fourth redistribution layer is electrically connected to the connection pad.

13. The fan-out semiconductor package of claim 11, wherein the first insulating layer has a thickness greater than that of the second insulating layer.

14. The fan-out semiconductor package of claim 11, wherein the third redistribution layer has a thickness greater than that of the redistribution layer of the first interconnection member.

15. The fan-out semiconductor package of claim 11, wherein the first redistribution layer is disposed on a level between the active surface and the inactive surface of the semiconductor chip.

16. The fan-out semiconductor package of claim 11, wherein a lower surface of the third redistribution layer is disposed on a level below a lower surface of the connection pad.

17. The fan-out semiconductor package of claim 1, further comprising:
a supporting member having a through hole,
wherein the semiconductor chip is disposed in the through hole of the supporting member.

18. The fan-out semiconductor package of claim 1, wherein the passivation layer directly contacts the side surface of the connection pad.

19. The fan-out semiconductor package of claim 1, wherein the passivation layer extends from the portion of the lower surface of the connection pad to at least a portion of the side surface in a thickness direction of the connection pad.

20. The fan-out semiconductor package of claim 1, wherein the passivation layer completely covers the side surface of the connection pad by extending from the portion of the lower surface of the connection pad to the active surface of the semiconductor chip.

21. The fan-out semiconductor package of claim 1, wherein at least a portion of the passivation layer is disposed between the semiconductor chip and the via in a thickness direction of the semiconductor chip.

22. The fan-out semiconductor package of claim 1, wherein the via directly contacts the passivation layer.

23. The fan-out semiconductor package of claim 1, wherein the encapsulant covers at least a portion of a side surface of the passivation layer.

* * * * *